(12) United States Patent
Lam et al.

(10) Patent No.: US 10,796,734 B1
(45) Date of Patent: Oct. 6, 2020

(54) APPARATUSES INCLUDING TEMPERATURE-BASED THRESHOLD VOLTAGE COMPENSATED SENSE AMPLIFIERS AND METHODS FOR COMPENSATING SAME

(71) Applicant: Micron Technology, Inc., Boise, ID (US)

(72) Inventors: Boon Hor Lam, Boise, ID (US); Karl L. Major, Boise, ID (US); Jonathan Hawkins, Boise, ID (US); Galaly Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/422,650

(22) Filed: May 24, 2019

(51) Int. Cl.
  *G11C 7/08* (2006.01)
  *G11C 7/22* (2006.01)
  *G11C 7/04* (2006.01)

(52) U.S. Cl.
  CPC .............. *G11C 7/08* (2013.01); *G11C 7/04* (2013.01); *G11C 7/22* (2013.01)

(58) Field of Classification Search
  None
  See application file for complete search history.

(56) References Cited

U.S. PATENT DOCUMENTS

2011/0149663 A1* 6/2011 Yoshida ............... G11C 11/4076
365/194

* cited by examiner

*Primary Examiner* — James G Norman
(74) *Attorney, Agent, or Firm* — Dorsey & Whitney LLP

(57) ABSTRACT

Systems, methods, and apparatuses for temperature-compensated operation of electronic devices are described. For example, an apparatus for performing voltage compensation on a sense amplifier based on temperature may include a sense amplifier control circuit coupled to the sense amplifier to provide a compensation pulse to the sense amplifier, wherein the sense amplifier operates in a voltage compensation phase during the compensation pulse. The apparatus may determine the compensation pulse responsive to a voltage compensation duration signal that is based on the operating temperature of the apparatus. The voltage compensation occurs when there is no activate command immediately before or immediately after so that compensation duration change do not happen during an activate command from the command decoder.

25 Claims, 8 Drawing Sheets

US 10,796,734 B1

APPARATUSES INCLUDING TEMPERATURE-BASED THRESHOLD VOLTAGE COMPENSATED SENSE AMPLIFIERS AND METHODS FOR COMPENSATING SAME

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be sensed and amplified by a sense amplifier to indicate the value of the data state stored in the memory cell.

Sense amplifiers are typically coupled to a pair of complementary digit lines to which a large number of memory cells (not shown) are connected. When memory cells are accessed, a row of memory cells are activated and sense amplifiers are used to amplify a data state for the respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line does not and may serve as a reference for the sensing operation. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

DETAILED DESCRIPTION

Components of memory devices may adjust operation or compensate for changes in operating temperature. As described herein, a sense amplifier, for example, may employ temperature adjusted threshold voltage compensation.

By way of example, voltage compensated sense amplifiers overcome process challenges on sense amp scaling by compensating for n-ch sense amplifier device Vt offsets. The sense amplifier compensation occurs over a compensation duration. However, when the compensation duration is static, the same compensation duration is applied throughout different operating temperature conditions. At lower temperatures, the n-ch Vt offsets may be more significant than at higher temperatures. The tRCD represents a minimum row address (RAS) to column address (CAS) delay, as measured by a minimum number of clock cycles required between activating a row of memory and accessing a memory cell in a column of the memory cells coupled to the activated row. At higher temperatures, timing margins of tRCD may be reduced, thereby increasing the likelihood of erroneously sensing data. To maintain desired or specified timing constraints, a sense amplifier may employ temperature-adjusted Vt compensation in which the duration of Vt compensation changes or is determined as a function of an operating temperature.

Figure 1:
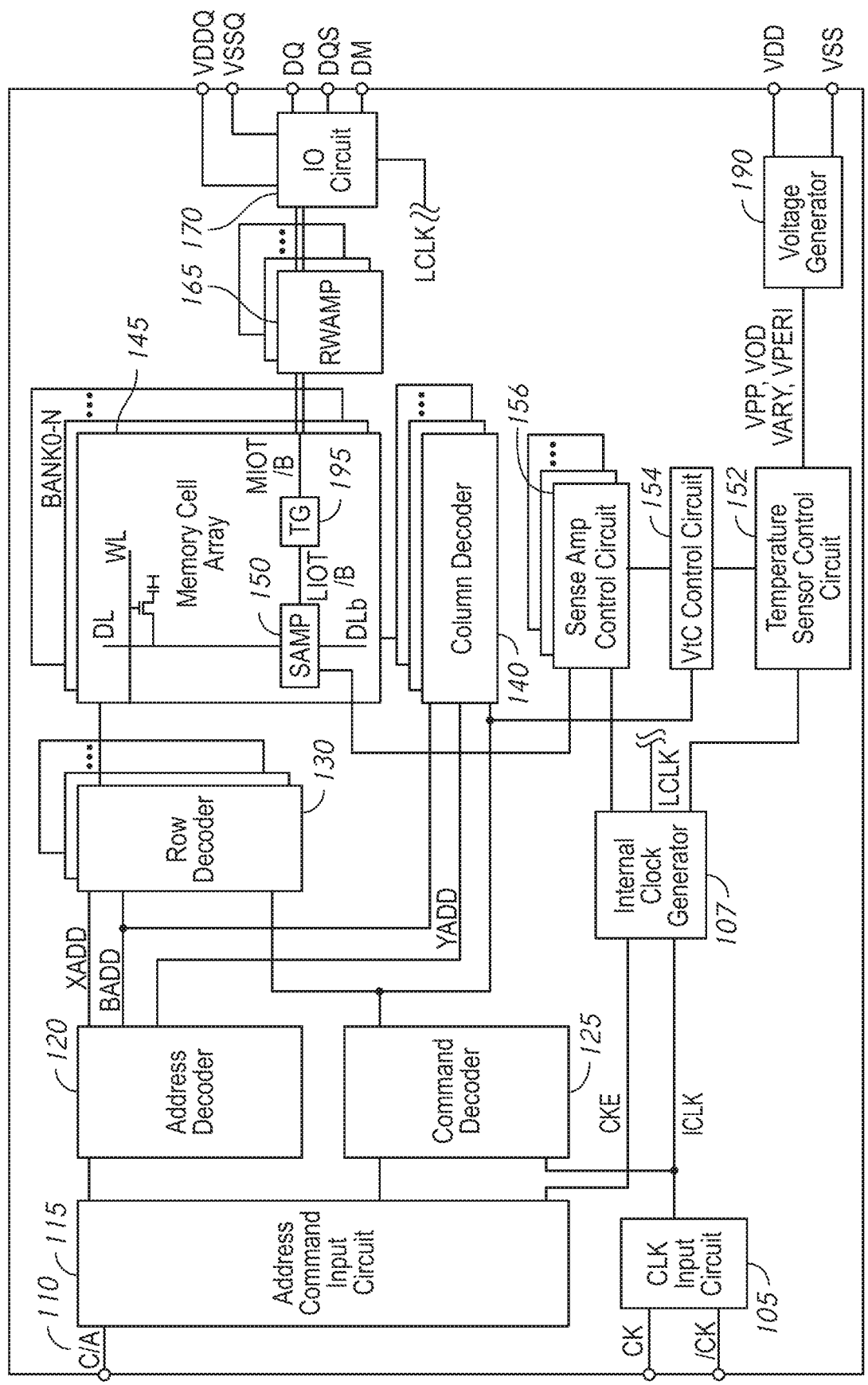
FIG. 1 is a schematic block diagram of a semiconductor device according to various embodiments of the disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL, and a plurality of memory cells MC arranged at intersections of the plurality of word lines WL and the plurality of digit lines DL. The selection of the word line WL for each bank BANK0-N is performed by a corresponding row decoder 130 and the selection of the digit line DL is performed by a corresponding column decoder 140. The plurality of sense amplifiers 150 are located for their corresponding digit lines DL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0–N, or any combination thereof. In some examples, the tRCD for the semiconductor device 100 may involve operations of the row decoders 130, the column decoders 140, and circuitry of the memory cells array 145 of each of the plurality of banks BANK0–N (e.g., including the plurality of sense amplifiers 150 and the transfer gates TG 195).

In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variances in the performance between circuit components of the sense amplifiers 150 (e.g., due to process, voltage, and temperature (PVT) variance) may reduce operational reliability of the semiconductor device 100. To mitigate effects of these variations, compensating for some of these threshold voltage differences may include, before activating the sense amplifier 150 to sense data, biasing digit lines DL and DLb coupled to the sense amplifiers 150 using internal nodes of the sense amplifier 150 that are configured to provide sensed data to an output (e.g., gut nodes). The bias of the digit lines DL and DLb may be based on threshold differences between at least two circuit components (e.g., transistors) of the sense amplifier 150. Compensating for threshold voltage differences between circuit components within the sense amplifier 150 may improve operational reliability.

In some examples, the semiconductor device 100 may include a sense amplifier control circuit 156 coupled to the sense amplifier 150 to provide a Vt compensation duration signal to the sense amplifier 150. The semiconductor device 100 may have multiple sense amplifier control circuits, each coupled to the sense amplifier 150 in a respective memory bank. In response to the Vt compensation duration signal, the time for Vt compensation of the sense amplifier 150 may be varied. In some examples, the semiconductor device 100 may include a temperature sensor control circuit 152 configured to measure the operating temperature of the semiconductor device and produce a digital output. In some examples, the temperature sensor 152 may include temperature sensor(s) and temperature compare circuitry coupled to the temperature sensor(s). The temperature compare circuitry may be configured to access the readings of the temperature sensor(s) and provide a temperature range signal. In some examples, the temperature range signal may represent output temperature operating ranges. The temperature range signal may include one or more temperature compare bits. For example, the temperature sensor control circuit 152 may generate an output signal including 6 bits to represent multiple temperature ranges, such as up to 64 ranges. Other temperature ranges may also be possible. In some examples, the temperature sensor control circuit 152 may be shared among multiple components and provide the temperature range signal for other components in the semiconductor device 100. For example, the temperature sensor control circuit 152 may provide the temperature range signal to a threshold voltage compensation (VtC) control circuit 154 and to a self-refresh (SREF) control circuit (not shown). The temperature sensor(s) may be existing DRAM operating temperature sensor(s), and the temperature sensor control circuit 152 may be implemented in another component of the semiconductor device 100, such as in the self-refresh (SREF) control circuit.

In some examples, the semiconductor device 100 may also include a VtC control circuit 154 coupled between the temperature sensor control circuit 152 and the sense amplifier control circuit 156. The VtC control circuit 154 may be configured to receive the temperature range signal from the temperature sensor control circuit 152 and provide a Vt compensation duration signal to the sense amplifier control circuit 156. The Vt compensation duration signal may be used to control a duration of a Vt compensation operation. In some examples, the Vt compensation duration signal may comprise one or more bits to represent multiple durations. In some examples, the VtC control circuit 154 may be coupled to the command decoder 125, and configured to receive a command signal (e.g., a row command). The VtC control circuit 154 may provide the Vt compensation duration signal when there is no active row command. In other words, the compensation changes do not happen in the middle of an active command, e.g., a Row command, a refresh or precharge command The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when an activate command is issued and a row address is timely supplied with the activate command, and a read command is issued and a column address is timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM, Similarly, when the activate command is issued and a row address is timely supplied with the activate command, and a write command is issued and a column address is timely supplied with the write command, the input/output circuit 170 may receive write data at the data terminals DQ, DQS, DM, together with a data strobe signal at DQS and a data mask signal at DM and provide the write data via the read/write amplifiers 165 to the memory cell array 145. The write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS.

These power supply voltages VDD and VSS may be supplied to a voltage generator circuit 190. The voltage generator circuit 190 may generate various internal voltages, VPP, VOD, VBLP, NSA_BIAS, VARY, VPERI, and the like based on the power supply voltages VDD and VSS. The internal voltage VPP is mainly used in the row decoder 130, the internal voltages VOD, VBLP, NSA_BIAS, and VARY are mainly used in the sense amplifiers 150 included in the memory cell array 145, and the internal voltage VPERI is used in many other circuit blocks. The IO circuit 170 may receive the power supply voltages VDD and VSSQ. For example, the power supply voltages VDDQ and VSSQ may be the same voltages as the power supply voltages VDD and VSS, respectively. However. the dedicated power supply voltages VDDQ and VSSQ may be used for the IO circuit 170.

Figure 2:
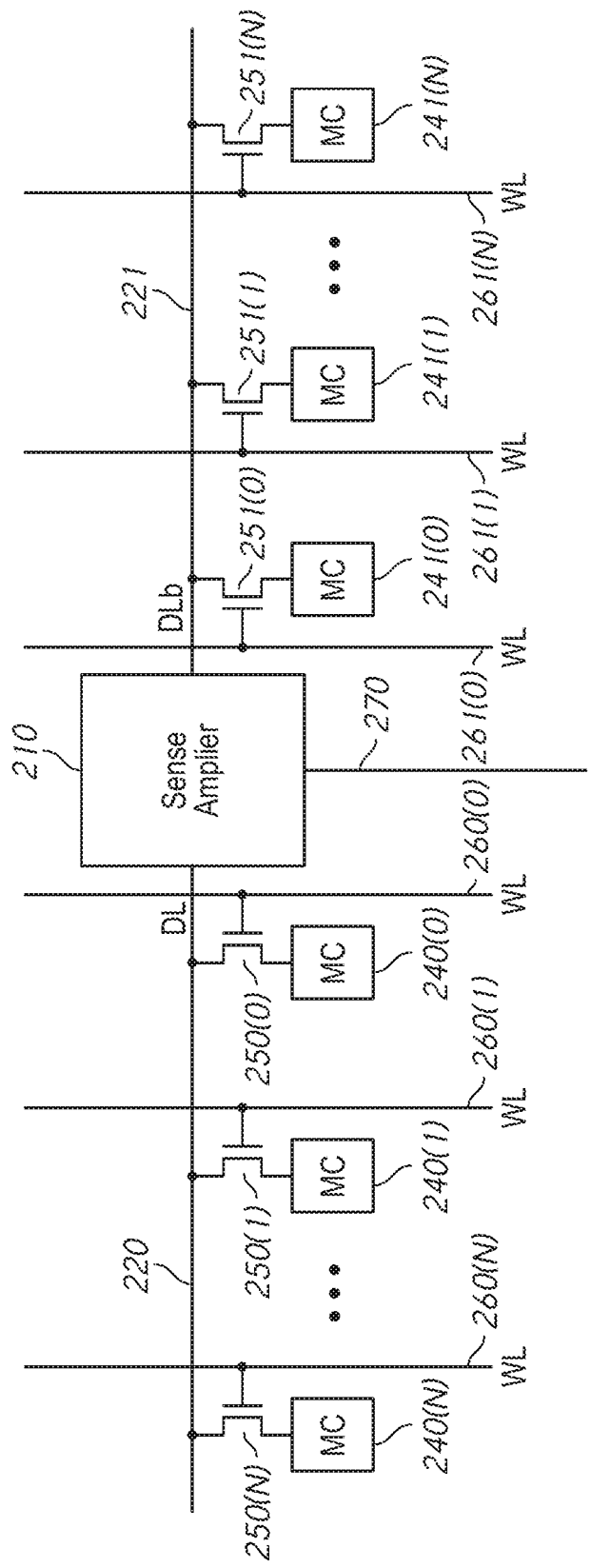
FIG. 2 is a schematic diagram of a sense amplifier and a pair of complementary digit lines according to various embodiments of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line DLb 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DLb 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), a bank0level sense amplifier control circuit (e.g., the control circuit 156 in FIG. 1), or any combination thereof.

In some examples, the memory 200 may operate in general phases or modes. A first phase (e.g., precharge phase) may be initiated in response to a precharge command PRE. During the precharge phase, the wordlines WL 260(0)-(N) and 261(0)-(N) may be set to an inactive state, and in response, the access devices 250(0)-(N) and 251(0)-(N) may all be disabled. Further, the digit lines DL 220 and DLb 221 and internal nodes of the sense amplifier 210 that are configured to provide a sensed data state to an output (e.g., gut nodes) may be precharged to and held at a precharge voltage, such as a digit line precharge voltage VBLP, until transitioning to a second phase.

In some examples, sense amplifier 210 includes threshold voltage compensation circuitry that compensates for threshold voltage mismatches between components of the sense amplifier 210 during a second phase (e.g., threshold voltage compensation phase). To perform the threshold voltage compensation, the sense amplifier 210 may, during a threshold voltage compensation phase, precharge or bias the digit lines DL 220 and DLb 221 such that a voltage difference between the digit line DL 220 and the DLb 221 is approximately equal to threshold voltage differences between at least two circuit components of the sense amplifier 210. In some examples, the threshold voltage difference may be based on threshold voltages of transistors of the sense amplifier 210. Compensating for threshold voltage differences between circuit components within the sense amplifier 210 may improve reliability.

A third phase is a sense amplifier activation phase. During the activation phase, a wordline WL of the wordlines WL 260(0)-(N) and 261(0)-(N) may be set to an active state, and, in response, an access device of the access devices 250(0)-(N) and 251(0)-(N) may be enabled to couple a respective memory cell of the memory cells 240(0)-(N) and 241(0)-(N) to one of the digit lines DL 220 and DLb 221. The sense amplifier 210 may be configured to perform a sense operation to sense a data state of the coupled memory cell. That is, during a sense operation, a data state stored by the coupled memory cell is sensed and amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary voltage level during the sense operation. After the sense operation, the circuitry of the memory 200 may remain in the activation phase or may transition back to the precharge phase in response to a precharge command PRE.

Similarly, a memory cell of the memory cells 241(0)-(N) is coupled to the digit line DLb 221 through the respective access device 251(0)-(N) in response to a respective word line 261(0)-(N) becoming active. A data state stored by the memory cell is sensed and amplified by the sense amplifier 210 to drive the digit line DLb 221 to a high or low voltage level corresponding to the sensed data state. The other digit line DL 220 is driven to the complementary voltage level (e.g., the high voltage level is complementary to the low voltage level and the low voltage level is complementary to the high voltage level) during the sense operation.

During the threshold voltage compensation operation, gut nodes of the sense amplifier 210 may be isolated from the digit lines DL 220 and DLb 221 in response to the control signals 270 (e.g., from a decoder circuit). In some examples, the control signals 270 may configure the sense amplifier 210 to isolate the gut nodes from the digit lines DL 220 and DLb 221 during the threshold voltage compensation phase. For example, during the threshold voltage compensation phase, the gut nodes of the sense amplifier 210 may be coupled to each other, to the digit lines DL 220 and DLb 221, and to a precharge voltage (e.g., VBLP) to precharge each to the precharge voltage. After the gut nodes of the sense amplifier 210 and the digit lines DL 220 and DLb 221 are at the VBLP voltage, the control signals 270 may configure the sense amplifier 210 to isolate the gut nodes from the digit lines DL 220 and DLb 221. A voltage difference between 220 and 221 may then be developed at the digit lines DL 220 and DLb 221 to provide threshold voltage compensation, as previously described.

Figures 3A, 3B:
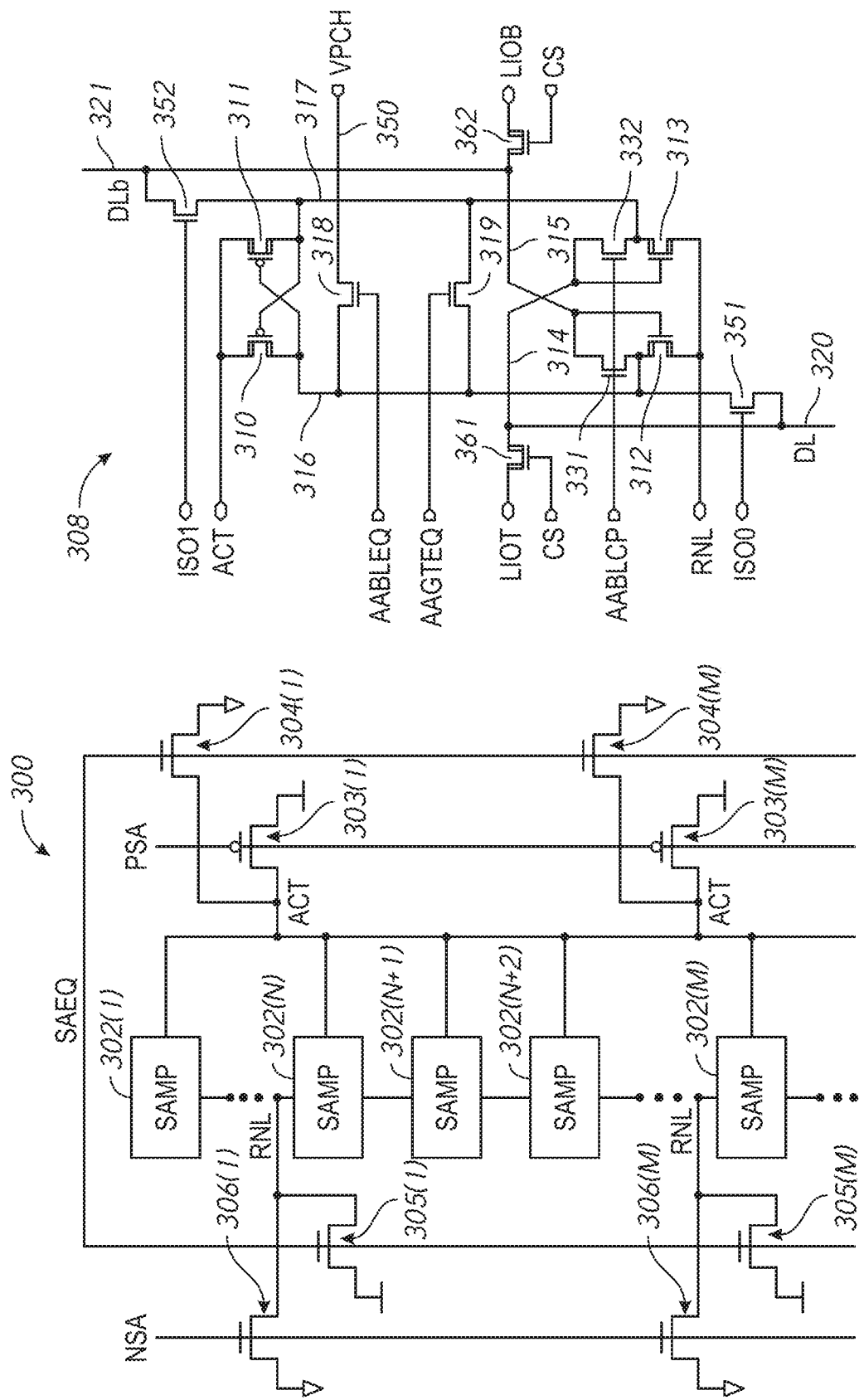
FIG. 3A is a schematic diagram of a voltage compensated sense amplifier array in a semiconductor device according to various embodiments of the disclosure.
FIG. 3B is a schematic diagram of a voltage compensated sense amplifier according to various embodiments of the disclosure.

FIG. 3A is a schematic diagram of a voltage compensated sense amplifier array in a semiconductor device according to various embodiments of the disclosure. In some examples, a sense amplifier array 300 may include multiple sense amplifiers, e.g., 302(1) . . . 302(N), 302(N+1), 302(N+2), . . . 302(M) etc. (collectively represented as 302), where each of the multiple sense amplifiers may be included in a respective memory bank, such as BANK0–N in FIG. 1. The multiple sense amplifiers 302 may be coupled to a Psense amplifier control line (e.g., an activation signal ACT), which may provide a supply voltage (e.g., an array voltage VARY) for an active "high" level. The multiple sense amplifiers 302 may also be coupled to a Nsense amplifier control line (e.g., a Row Nsense Latch signal RNL) that may provide a reference voltage (e.g., a ground (GND) voltage) for an active "low" level. The transistors 304(1), . . . 304(M) and transistors 305(1), . . . 305(M) may couple the activation signal line ACT to the ground (GND) voltage and couple the Row Nsense Latch signal RNL to the supply voltage, respectively, responsive to equilibrating signals SAEQ provided on the gates of transistors 304(1), . . . 304(M) and transistors 305(1), . . . 305(M).

In some examples, each of the Psense amplifier control line (e.g., ACT) and Nsense amplifier control line (e.g., RNL) may be coupled to a corresponding p-type transistor 303(1), . . . 303(M) and n-type transistor 306(1), . . . 306(M), respectively. The p-type transistor may be controlled by a Psense amplifier activation signal PSA provided to the gate of the transistor 303(1), . . . 303(M). The n-type transistor may be controlled by a Nsense amplifier activation signal NSA provided to the gate of transistor 306(1), . . . 306(M). When the Nsense amplifier activation signal NSA becomes active high and the Psense amplifier activation signal PSA becomes low, the Vt compensation is activated.

FIG. 3B is a circuit diagram of a sense amplifier 308 in accordance with some embodiments of the disclosure. The sense amplifier 308 may be one of the multiple sense amplifiers 302(1), . . . 302(M) in FIG. 1, and may be included in one or more of the sense amplifiers 150 of FIG. 1. and/or the sense amplifier 210 of FIG. 2. The sense amplifier 308 may include transistors (e.g. p-type field effect transistors (PFET)) 310, 311 having drains coupled to drains of additional transistors (e.g., n-type field effect transistors (NFET)) 312, 313, respectively. The first type of transistors 310, 311 and the second type of transistors 312, 313 form complementary transistor inverters including a first inverter including the transistors 310 and 312 and a second inverter including the transistors 311 and 313. The first type of transistors 310, 311 may be coupled to a power supply, e.g., Psense amplifier control line (e.g., an activation signal ACT), which may provide a supply voltage (e.g., an array voltage VARY) for an active "high" level. The second type of transistors 312, 313 may be coupled to a power supply, e.g., Nsense amplifier control line (e.g., a Row Nsense Latch signal RNL) that may provide a reference voltage (e.g., a ground (GND) voltage) for an active "low" level. The sense amplifier 300 may sense and amplify the data state applied to sense nodes 314, 315 through the digit (or bit) lines DL 320 and DLb 321, respectively. Nodes 316 and 317 that may be gut nodes at the drains of the second type of transistors 312, 313 may be coupled to the digit lines DL 320 and DLb 321 via isolation transistors 351 and 352. The isolation transistors 351 and 352 may be controlled by isolation signals ISO0 and ISO1. Nodes 314 and 315 that may be sense nodes at digit lines DL 320 and DLb 321 may be coupled to local input/output nodes A and B (LIOA/B) through the second type of transistors 361 and 362, respectively. The transistors 361 and 362 may be rendered conductive when a column select signal CS is active. LIOT and LIOB may correspond to the LIOT/B lines of FIG. 1, respectively.

The sense amplifier may further include additional second type of transistors 331, 332 that have drains coupled to the sense nodes 315 and 314 and sources coupled to both the gut nodes 316 and 317 and the drains of the second type of transistors 312 and 313. Gates of the second types of transistors 331, 332 may receive a bit line compensation signal AABLCP and may provide voltage compensation for threshold voltage imbalance between the second type of transistors 312 and 313. The sense amplifier 300 may further include transistors 318, 319, where the transistor 318 may couple the gut node 316 to a power bus 350 and the transistor 319 may couple the gut node 316 to the gut node 317. The power bus 350 may be coupled to a node that is configured to a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 318 and 319 may couple the power bus 350 to the gut nodes 316 and 317 responsive to equilibrating signals AAGTEQ and AABLEQ provided on gates of the transistors 318 and 319.

Figure 4:
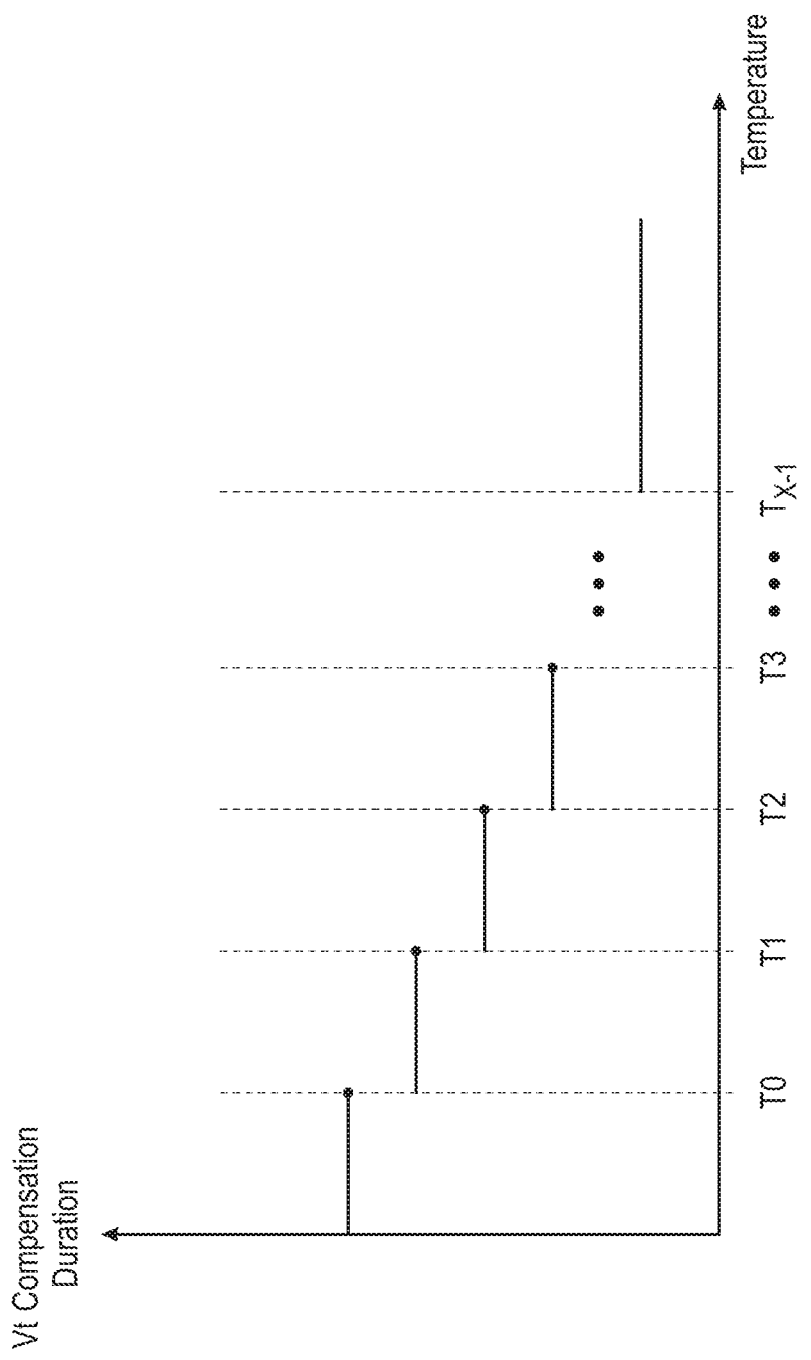
FIG. 4 is a diagram of varying threshold voltage (Vt) compensation durations based on temperatures according to various embodiments of the disclosure.

In operation, the sense amplifier 300 may be configured to sense a data state of a coupled memory cell on the data lines DL 320 and DLb 321 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0–N of FIG. 1), or any combination thereof FIG. 4 is a diagram of varying Vt compensation durations based on temperatures according to various embodiments of the disclosure. For example, as the temperature ranges increase, e.g., from less than T0, to between T0 and T1, to between T1 and T2, . . . , the corresponding Vt compensation durations may decrease. Other relationships may also be possible. In some embodiments of the disclosure, the relationships between the temperatures and Vt compensation durations may be pre-stored, e.g., pre-defined from fuse blow trimming to the part, which will be described in FIG. 5.

Figure 5:
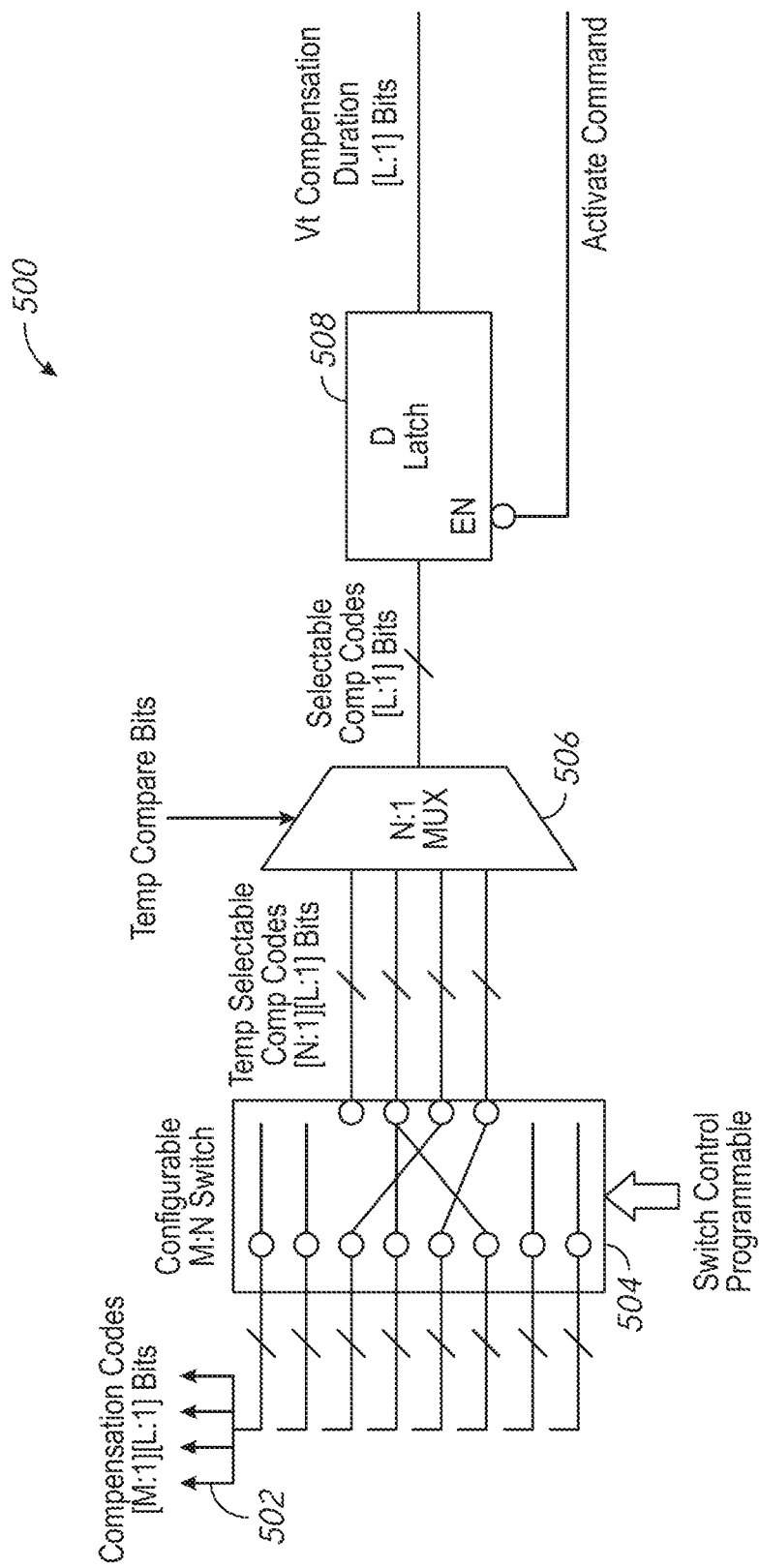
FIG. 5 is a schematic diagram of a Vt compensation control circuit according to various embodiments of the disclosure.

FIG. 5 is a schematic diagram of a VtC control circuit according to various embodiments of the disclosure. In some examples, the VtC control circuit 500 may be implemented in the VtC control circuit 154 (in FIG. 1). The VtC control circuit 500 may include a configurable switch 504 to define the temperature-Vt compensation duration relationships. The switch may be configured to couple a plurality of inputs that are each associated with a compensation code to a plurality of outputs that are each associated with a temperature selectable compensation code. The switch is operable responsive to control signaling. For example, the configurable switch 504 may be coupled to the signal lines 502 to receive compensation codes. In some examples, the compensation codes may represent the Vt compensation durations. For example, the compensation codes may include [M:1][L:1] bits, where M stands for the number of compensation duration ranges, and L stands for the number of bits representing each Vt compensation duration. The configurable switch 504 may map the temperature range to the Vt compensation duration range, e.g., as an M:N switch, where N stands for the number of temperature ranges (e.g., the Tx ranges in FIG. 4). In some examples, the mapping between the temperature ranges and the Vt compensation duration ranges such as shown in FIG. 4, is pre-stored and defined in the configurable switch 504.

With further reference to FIG. 5, in some examples, the configurable switch 504 may be configured by a programmable switch control, such as fuses, where the output of the configurable switch 504 may include temperature selectable compensation codes. In some examples, the configurable switch 504 may include [N:1] output lines, with each line including L bits (representing compensation durations) and being provided to a multiplexer 506. The multiplexer may be coupled to the plurality of outputs of the switch 504 to receive the temperature selectable compensation codes and configured to select a compensation code responsive to a temperature range signal indicating an operating temperature of the semiconductor device. For example, the multiplexer 506 may be coupled to the temperature compare bits (e.g., from the temperature sensor control circuit 152 in FIG. 1) and configured to output one of the N input based on the value of the temperature compare bits. If the temperature compare bits have a value indicating a mid-temperature range, the output signal may include one L-bit selectable Vt compensation code (compensation duration) corresponding to that mid-temperature range.

In some examples, the VtC control circuit 500 may further include a latch circuit 508 configured to provide the Vt compensation code to the sense amplifier control circuit 156 (in FIG. 1) responsive to an activate command, such as row command, ACTIVE command, or refresh command from the command decoder (e.g., 125 in FIG. 1). For example, the latch circuit 508 may include a D Latch circuit coupled to the ACT Refresh signal line from the command decoder. When the activate command is inactive (e.g., at low logic level), which means that the semiconductor device (e.g., 100 in FIG. 1) is not active, nor is in refresh or precharging operation, the D latch 508 is enabled and latches the selectable compensation code to provide the Vt compensation duration signal (e.g., L-bits) to the sense amplifier control circuit (e.g., 156 in FIG. 1). When the semiconductor device (e.g., 100 in FIG. 1) receives an active activate command, e.g., refreshing or precharging command, a logic level of the Vt compensation duration signal provided by the D latch 508 no longer changes.

Figure 6:
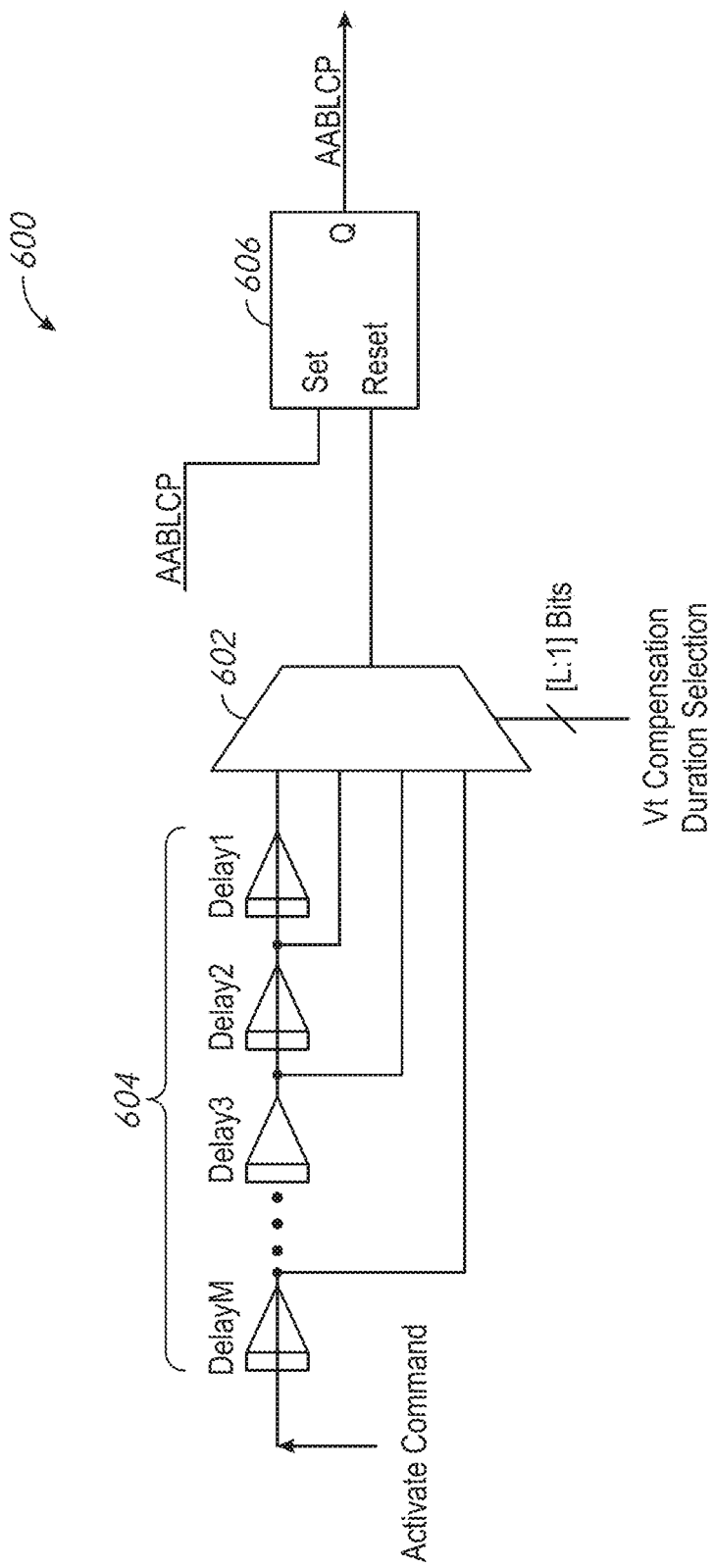
FIG. 6 is a schematic diagram of a sense amplifier control circuit according to various embodiments of the disclosure.

FIG. 6 is a schematic diagram of a sense amplifier control circuit according to various embodiments of the disclosure. In some examples, the sense amplifier control circuit 600 may be implemented in the sense amplifier control circuit 156 (in FIG. 1), which is configured to provide sense amplifier compensation control signals responsive to the Vt compensation duration signal provided by the VtC control circuit (e.g., 154 in FIG. 1, 500 in FIG. 5). In some examples, the sense amplifier control circuit 600 may include a multiplexer 602 having its input coupled to a series of delay lines. For example, the sense amplifier control circuit may include multiple delay circuits 604 coupled in series, where the output of each delay circuit is coupled to the input of the multiplexer 602. As such, each input of the multiplexer 602 may provide a signal with different delay. In some examples, the delay circuits 604 may be triggered by an activation signal, such as an ACTIVE command from the command decoder (e.g., 125 in FIG. 1). When the activation signal is active, each of the delay circuits 604 may propagate the activation signal having a delay to be provided to the multiplexer 602.

With further reference to FIG. 6, in some examples, the multiplexer 602 may be coupled to the Vt compensation duration line from the Vt control circuit (e.g., 154 in FIG. 1, 500 in FIG. 5). In some examples, the multiplexer 602 is configured to select one of the delay signals from the delay circuits 604 in responsive to the Vt compensation duration signal In some examples, the VtC control circuit 600 may include a Vt compensation duration circuit 606 coupled to the output of the multiplexer 602 and configured to provide various control signals for the compensation of a sense amplifier, e.g., NSA, PSA, and AABLCP or a combination thereof. In some examples, the Vt compensation duration may be controlled by the width of compensation pulse between activation of the compensation activation signal and a deactivation signal. To control the width of the compensation pulse, in some examples, the time of the compensation is activated may be changed. For example, the activation of the compensation may be responsive to the NSA signal becoming active and the PSA signal becoming inactive. In some scenarios, the time the compensation is deactivated may also be changed. For example, the deactivation of the compensation may be responsive to the AABCLP signal becoming inactive. In some examples, both the beginning and ending time of the compensation may be changed.

In a non-limiting example, the Vt compensation duration circuit 606 may be configured to provide a AABCLP control signal for the sense amplifier responsive to an activation signal for compensation and the Vt compensation duration signal from the multiplexer 602. For example, the Vt compensation duration circuit 606 may receive a bit line compensation signal AABCLP control signal (e.g., at a high logic level) and control the deactivation of compensation by deactivating the AABCLP (e.g., at a low logic level) based on the Vt compensation duration signal. In a non-limiting example, the Vt compensation duration circuit 606 may include a SR latch, which receives the AABCLP signal at the Set line and outputs the duration controlled control signal AABCLP at the Q output. The output of the multiplexer 602 may be coupled to the Reset line of the SR latch. The AABCLP at the Q output may be coupled to the sense amplifier (e.g., 308 in FIG. 3B) to provide the control signal for compensation. When the received AABCLP at the Set line is high, the AABCLP at the Q output will remain high until a signal at the Reset line become high. In other words, a high logic level signal at the output of the multiplexer 602 will drive the AABCLP signal to become deactivated (e.g., at a low logic level). The time when the high logic level signal arrives at the output of the multiplexer 602 may be controlled by the Vt compensation duration line and the delay provided by one or more delay circuits 604.

In such case, the time the compensation ends may be changed based on the deactivation time of the AABCLP signal. As a result, the width of the compensation pulse may be changed. For example, if the Vt compensation duration signal indicates a short compensation duration, the width of the compensation pulse provided by the Vt compensation duration circuit 606 may be relatively short. If the Vt compensation duration signal indicates a long compensation duration, the width of the compensation pulse provided by the Vt compensation duration circuit 606 may be longer.

In some non-limiting examples, the VtC control circuit 600 may also be configured to provide other sense amplifier control signals, such as PSA and NSA. For example, the NSA and PSA may be activated or deactivated, respectively, responsive to the ACTIVE command signal. The timings of the control signals are further described with respect to FIG. 7.

Figure 7:
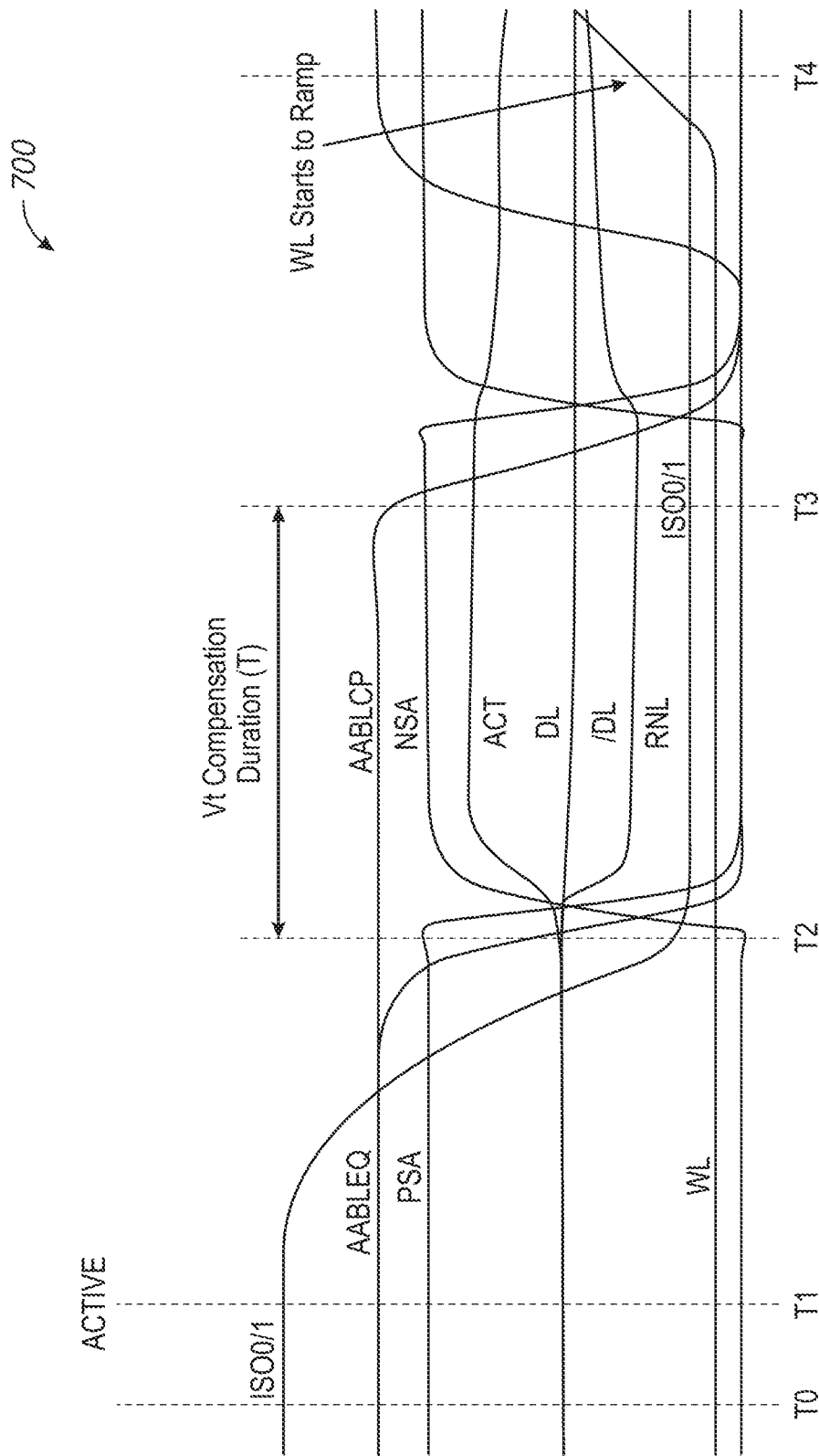
FIG. 7 is a timing diagram of various signals during a sense operation in accordance with various embodiments of the disclosure.

FIG. 7 is a timing diagram 700 of various signals during a sense operation for a sense amplifier, such as 308 (in FIG. 3B), in accordance with some embodiments of the disclosure. During the pre-charge phase (e.g., between times T0 to T1 of the timing diagram), the gut nodes 316 and 317 may be precharged at the VPCH voltage. For example, the power bus 350 may be supplied with the VPCH voltage, and the AABLCP signal, the ISO0/ISO1 signals, and the AABLEQ signal may be in their active states, respectively. Accordingly, while in the pre-charge phase, each of the digit lines DL 320 and DLb 321, the sense nodes 314 and 315 and the gut nodes 316 and 317 may be precharged to the precharge voltage VPCH. In some examples, the VPCH voltage may be the VBLP voltage. In some examples, the VBLP voltage may be approximately half of the VARY voltage.

After the pre-charge phase, the sense amplifier 308 may enter the threshold voltage compensation phase to perform a threshold voltage compensation operation (e.g., between times T2 and T3 of the timing diagram). Voltage on the data lines DL 320 and DLb 321 are biased from the VPCH voltage (e.g., VBLP voltage) to compensate (e.g., provide threshold voltage compensation) for threshold voltage differences between the transistors 312, 313. During the threshold voltage compensation phase, at time T2, the ISO0 and ISO1 signals and the AAGTEQ and AABLEQ signals may be set to respective inactive state to disable the transistors 351, 352, 318 and 319. The AABLCP signal may remain in an active state to enable the transistors 331 and 332 to couple the nodes 314 and 315 to the gut nodes 317 and 316, respectively. Additionally, the drain and the gate of the transistor 312 may be coupled and the drain and the gate of the transistor 313 may be coupled.

At time T2, the Vt compensation control signals may be activated/deactivated. For example, the NSA and PSA provided by the VtC control circuit (154 in FIG. 1) may become active and inactive, respectively. The AABLCP signal provided by the VtC control circuit (154 in FIG. 1) may also be active, and threshold voltage compensation may be performed during the Vt compensation duration between times T2 and T3. At time T3, the threshold voltage compensation phase may be completed responsive to the AABLCP signal provided by the VtC control circuit (154 in FIG. 1) becoming an inactive state, which disables the transistors 331 and 332 and decouples the nodes 314 and 315 from the gut nodes 317 and 316, respectively. As previously described, a compensation pulse (e.g., provided by Vt compensation duration circuit) may be active between activation of the compensation activation signal and deactivation of the AABCLP signal. As a result, the width of the compensation pulse may control a compensation duration for the threshold voltage compensation. For example, by varying the width of the compensation pulse, the compensation duration may be varied. Where the width of the compensation pulse is based on the Vt compensation duration signal, which is itself based on a temperature range signal from a temperature sensor control circuit, the compensation duration may be based on temperature.

Since the Vt compensation is activated when there is no activate command, in some examples, the wordlines WL may start to ramp after the Vt compensation is complete. This is different from other systems, in which the wordlines WL may be activated prior to the completion of the compensation. For example, at time T4, the wordlines WL may become active to reach a sufficient voltage to enable (e.g., activate) an access device (e.g., one of the access devices 250(0)-(N) and 251(0)-(N) of FIG. 2) of the target memory cell (e.g., one of the memory cells MC of FIG. 1 or one of the memory cells 240(0-(N) or 241(0)-(N) of FIG. 2).

Between T3 and T4, during a gut equalize phase, the gut nodes 317 and 316 may be decoupled from the digit lines DL 320 and DLb 321 and may be coupled to each other to equalize voltages between the gut nodes 316, 317 to the VPCH voltage. During this phase, at time T3, the AABLEQ signal may transition to an active state. While the AABLCP signal is set to the inactive state, the transistors 332 and 331 may decouple the nodes 314 and 315 from the gut nodes 317 and 316. While the equilibrating signals AAGTEQ and AABLEQ are set to the active state, the transistors 318 and 319 may couple the VPCH voltage from the power bus 350 to the gut nodes 316, 317. While the ISO0 and ISO1 signals are set to the inactive state, the isolation transistors 351 and 352 may decouple the gut nodes 317 and 316 from the digit lines DL 320 and DLb 321. After the gut nodes 316 and 317 are precharged to the VPCH voltage, the AAGTEQ and AABLEQ signals may be set to inactive states to disable the transistors 318 and 319.

Whereas not shown in the figure, the sense amplifier may subsequently go through the sense phase, during which the sense and amplify operations are then performed with the threshold voltage compensation to balance the responses of the second type of transistors 312 and 313. For example, in response to a memory cell (e.g., one of the memory cells 240(0)-(N) or memory cells 241(0)-(N) of FIG. 2) being coupled to a digit line DL 320 or DLb 321 through its respective access device (e.g., the respective access device 250(0)-(N) or access device 251(0)-(N) of FIG. 2), a voltage difference is created between the digit lines DL 320 and DLb 321 (e.g., via the guts nodes 316 and 317). Thus, the voltage difference is sensed by the second type of transistors 312, 313 as the sources of the second type of transistors 312, 313 begin to be pulled to ground through fully activated RNL and one of the second type of transistors 312, 313 with a gate coupled to the digit line DL 320 or DLb 321 with the slightly higher voltage begins conducting. When a memory cell coupled to the gut node 316 through the digit line DL 320 stores a high data state, for example, the transistor 313 may begin conducting. Additionally, the other transistor 312 may become less conductive as the voltage of the gut node 317 with the slightly lower voltage decreases through the conducting transistor 313. Thus, the slightly higher and lower voltages are amplified to logic high and logic low voltages while the isolation signals ISO0 and ISO1 in the active state. After the data state of the memory cell is sensed, and the sense nodes 314, 315 are each pulled to a respective one of the ACT signal and RNL signal voltages, a read may be performed in response to a READ command.

Figure 8:
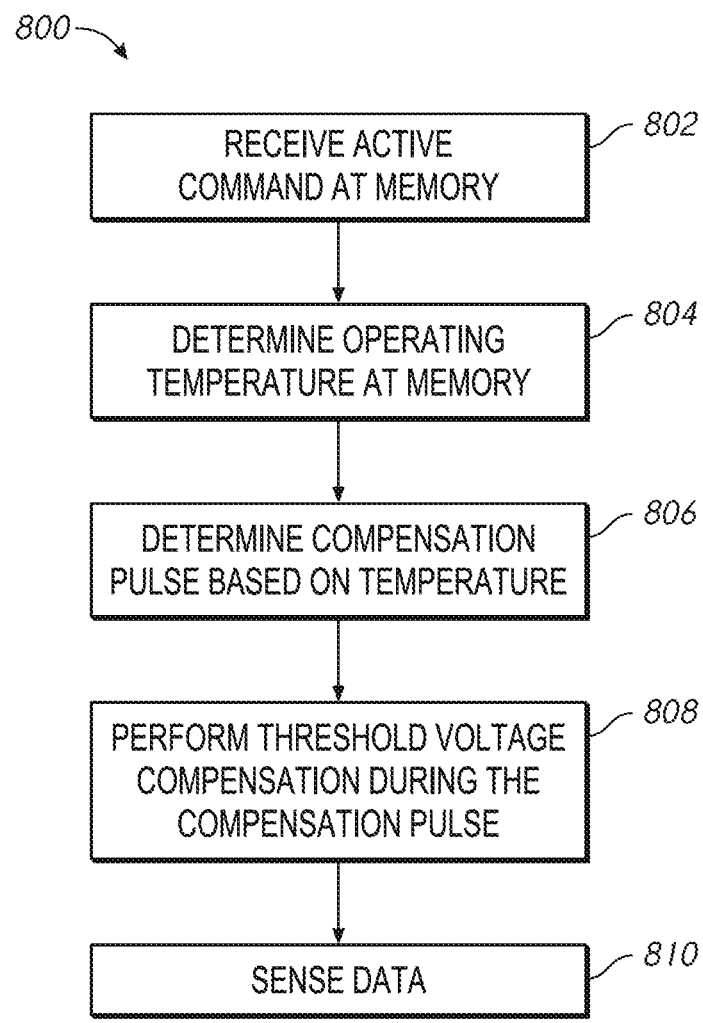
FIG. 8 is a flow diagram of sensing data at a memory according to various embodiments of the disclosure.

FIG. 8 is a flow diagram of sensing data at a memory according to various embodiments of the disclosure. In some embodiments, a process 800 may be implemented by various embodiments shown and described with reference to FIGS. 1-7. In some examples, the process 800 may include receiving an activate command at a memory at 802; determining an operating temperature of the memory at 804; and determining a compensation pulse based on the temperature at 806. For example, the compensation pulse may be determined by the threshold voltage compensation duration circuit (e.g., 606 in FIG. 6). The process 800 may further include performing a threshold voltage compensation operation during the compensation pulse to a sense amplifier of the memory at 808, and sensing data of a memory at the sense amplifier at 810. In some examples, performing the threshold voltage compensation operation may also be responsive to the activate command In sensing the data, the data may be sensed from a memory cell, where the memory cell is coupled to one of complementary digit lines of the sense amplifier in response to activation of a word line.

In some examples, the process 800 may further include precharging gut nodes, sense nodes and the complementary digit lines of the sense amplifier at a precharge voltage, before performing the threshold voltage compensation operation. In determining the compensation pulse, a delay signal may be selected from a plurality of delay signals responsive to a voltage compensation duration signal, and the compensation pulse is determined based at least on the delay signal. The voltage compensation duration signal may be selected from a plurality of compensation codes responsive to temperature compare bits indicating the operating temperature of the memory. A bit line compensation signal may be received, and the bit line compensation signal may be latched at a high logic level, and the bit line compensation signal deactivated responsive to the voltage compensation duration signal. The process may further including latching the voltage compensation duration signal when the activate command is inactive.

The above illustrated embodiments in FIGS. 1-8 provide advantages in threshold voltage compensating of a sense amplifier in a semiconductor device. For example, the Vt compensation duration may vary based on the operating temperature of the semiconductor device. At low temperature, the n-ch Vt offsets may be improved. Similarly, at hot temperature, the constraint on tRCD may be reduced. All these result in various performance improvements of the semiconductor device.

Various embodiments of the present disclosure are explained herein in detail with reference to the accompanying drawings. The foregoing detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a switch configured to couple a plurality of inputs that are each associated with a compensation code to a plurality of outputs that are each associated with a temperature selectable compensation code, wherein the switch is operable responsive to control signaling from the apparatus;
a first multiplexer coupled to the plurality of outputs of the switch to receive the temperature selectable compensation codes and configured to select a compensation code responsive to a temperature range signal indicating an operating temperature of the apparatus; and
a sense amplifier control circuit coupled to the first multiplexer and at least one sense amplifier and configured to provide a compensation pulse to the sense amplifier responsive to the selected compensation code to cause the sense amplifier to perform a voltage compensation during a width of the compensation pulse.

2. The apparatus of claim 1 further comprising a latch circuit coupled between the first multiplexer and the sense amplifier and configured to latch the selected compensation code responsive to an enable signal.

3. The apparatus of claim 2, wherein the latch circuit is enabled to latch the selected compensation code responsive to an inactive activate command.

4. The apparatus of claim 1, wherein the switch control comprises one or more fuses.

5. The apparatus of claim 1, wherein the sense amplifier control circuit comprises:
a second multiplexer coupled to multiple delay signal lines and configured to select at least one of the multiple delay signal lines responsive to the selected compensation code from the first multiplexer; and
a threshold voltage compensation duration circuit coupled to the second multiplexer and configured to generate the compensation pulse based on the selected delay signal line.

6. The apparatus of claim 5, wherein the sense amplifier control circuit further comprising multiple delay circuits each coupled to a respective signal line of the multiple delay signal lines.

7. The apparatus of claim 6, wherein the threshold voltage compensation duration circuit is configured to latch a bit line compensation signal at a high logic level and deactivate the bit line compensation signal responsive to the selected delay signal line.

8. The apparatus of claim 7, wherein the threshold voltage compensation duration circuit comprises a SR latch circuit.

9. The apparatus of claim 1, wherein the width of the compensation pulse is based on the compensation code.

10. An apparatus, comprising:
a plurality of memory banks each comprising a memory cell array and a sense amplifier;
a sense amplifier control circuit coupled to the sense amplifier of at least one of the plurality of memory banks to provide a compensation pulse to the sense amplifier responsive to a voltage compensation duration signal, wherein the sense amplifier is configured to perform threshold voltage compensation operation during the compensation pulse; and a voltage compensation control circuit coupled to the sense amplifier control circuit and configured to provide the voltage compensation duration signal, wherein the voltage compensation duration signal is based on temperature compare bits indicating an operating temperature.

11. The apparatus of claim 10, wherein the voltage compensation control circuit comprises a multiplexer coupled to the sense amplifier control circuit and configured to provide the voltage compensation duration signal to the sense amplifier control circuit from a plurality of temperature selectable compensation codes responsive to the temperature compare bits.

12. The apparatus of claim 11, wherein the voltage compensation control circuit further comprises a switch coupled to the multiplexer and configured to correspond multiple compensation codes to respective temperature selectable compensation codes of the plurality of temperature selectable compensation codes.

13. The apparatus of claim 12, wherein the switch is configurable by a switch control comprising one or more fuses.

14. The apparatus of claim 13, wherein the voltage compensation control circuit further comprising a latch circuit coupled between the multiplexer and the sense amplifier control circuit and configured to latch the selected voltage compensation duration signal from selected compensation code responsive to an enable signal.

15. The apparatus of claim 14, wherein the latch circuit is enabled to latch the selected voltage compensation duration signal responsive to an inactive activate command.

16. The apparatus of claim 10, wherein the sense amplifier control circuit comprises:

a multiplexer coupled to multiple delay signal lines and configured to select at least one of the multiple delay signal lines responsive to the voltage compensation duration signal; and a threshold voltage compensation duration circuit coupled to the multiplexer and configured to generate the compensation pulse based on the selected delay signal line.

17. The apparatus of claim 16, wherein the sense amplifier control circuit further comprising multiple delay circuits each coupled to a respective signal line of the multiple delay signal lines, wherein the multiple delay circuits are activated by an activate command from the command decoder.

18. The apparatus of claim 10, wherein the width of the compensation pulse is based on the compensation code.

19. The apparatus of claim 10, wherein a width of the compensation pulse decreases as the operating temperature increases.

20. A method, comprising:

receiving an activate command at a memory;

determining an operating temperature of the memory;

responsive to the activate command, performing a threshold voltage compensation operation during a compensation pulse to a sense amplifier of the memory, wherein the compensation pulse is based on the operating temperature; and sensing data of a memory cell at the sense amplifier, wherein the memory cell is coupled to one of complementary digit lines of the sense amplifier in response to activation of a wordline.

21. The method of claim 20 further comprising, before performing the threshold voltage compensation operation, precharging gut nodes, sense nodes and the complementary digit lines of the sense amplifier at a precharge voltage.

22. The method of claim 20 further comprising determining the compensation pulse by:

selecting a delay signal from a plurality of delay signals responsive to a voltage compensation duration signal, wherein the voltage compensation duration signal is selected from a plurality of compensation codes responsive to temperature compare bits indicating the operating temperature of the memory; and determining the compensation pulse based at least on the delay signal.

23. The method of claim 22 further comprising latching the voltage compensation duration signal when the activate command is inactive.

24. The method of claim 20, wherein:

performing the threshold voltage compensation operation comprises at least determining a threshold voltage compensation; and sensing the data of the memory cell is based at least on the threshold voltage compensation.

25. The method of claim 24, wherein the threshold voltage compensation comprises a voltage difference between at least two complementary digit lines coupled to the sense amplifier.

* * * * *